US010365444B2

(12) United States Patent
Morioka et al.

(10) Patent No.: US 10,365,444 B2
(45) Date of Patent: Jul. 30, 2019

(54) OPTICAL RECEPTACLE AND OPTICAL MODULE

(71) Applicant: Enplas Corporation, Saitama (JP)

(72) Inventors: Shimpei Morioka, Saitama (JP); Naofumi Mirumachi, Saitama (JP)

(73) Assignee: Enplas Corporation, Saitama (JP)

( * ) Notice: Subject to any disclaimer, the term of this patent is extended or adjusted under 35 U.S.C. 154(b) by 61 days.

(21) Appl. No.: 15/546,308

(22) PCT Filed: Jan. 21, 2016

(86) PCT No.: PCT/JP2016/051683
§ 371 (c)(1),
(2) Date: Jul. 26, 2017

(87) PCT Pub. No.: WO2016/121615
PCT Pub. Date: Aug. 4, 2016

(65) Prior Publication Data
US 2018/0017743 A1    Jan. 18, 2018

(30) Foreign Application Priority Data

Jan. 28, 2015  (JP) .................................. 2015-014292

(51) Int. Cl.
*G02B 6/42*    (2006.01)
*G02B 6/28*    (2006.01)
(Continued)

(52) U.S. Cl.
CPC .......... *G02B 6/4214* (2013.01); *G02B 6/2817* (2013.01); *G02B 6/3897* (2013.01);
(Continued)

(58) Field of Classification Search
CPC .... G02B 6/42; G02B 19/0076; G02B 6/4214; G02B 6/4249; G02B 6/4286;
(Continued)

(56) References Cited

U.S. PATENT DOCUMENTS 6,384,881 B1 * 5/2002 Arai ...................... G01D 11/28
                                                    349/61
7,133,091 B2 * 11/2006 Ohsumi ............... G02B 6/0038
                                                    349/64
(Continued)

FOREIGN PATENT DOCUMENTS

JP    60-103324 A    6/1985
JP    2013-137507 A  7/2013
WO    2013/140922 A1 9/2013

OTHER PUBLICATIONS

International Search Report from International Application No. PCT/JP2016/051683 dated Mar. 29, 2016.

*Primary Examiner* — Mina M Shalaby

(74) *Attorney, Agent, or Firm* — Brundidge & Stanger, P.C.

(57) ABSTRACT

The optical receptacle according to the present invention comprises: a first optical surface, a second optical surface, an optical separating part and a third optical surface. The optical separating part includes a first dividing reflection surface for causing a part of the emittance light incident on the first optical surface to be internally reflected toward the second optical surface as the signal light, and a second dividing reflection surface for causing a part of the emittance light incident on the first optical surface to be internally reflected toward the third optical surface as the monitor light. The entire light path between the first optical surface, the optical separating part, and the second optical surface is located inside the optical receptacle.

4 Claims, 14 Drawing Sheets

(51) Int. Cl.
*G02B 6/38* (2006.01)
*G02B 27/10* (2006.01)
*H01S 5/022* (2006.01)
*H01S 5/42* (2006.01)
*G02B 19/00* (2006.01)

(52) U.S. Cl.
CPC .............. *G02B 6/42* (2013.01); *G02B 6/4206* (2013.01); *G02B 6/4225* (2013.01); *G02B 6/4249* (2013.01); *G02B 6/4286* (2013.01); *G02B 19/0028* (2013.01); *G02B 19/0076* (2013.01); *G02B 27/108* (2013.01); *H01S 5/02288* (2013.01); *H01S 5/423* (2013.01); *H01S 5/02284* (2013.01); *H01S 5/02292* (2013.01)

(58) Field of Classification Search
CPC .. G02B 6/3897; G02B 6/4206; G02B 6/4225; G02B 27/108; G02B 19/0028; G02B 6/2817; H01S 5/02288; H01S 5/423; H01S 5/02284; H01S 5/02292
See application file for complete search history.

(56) References Cited

U.S. PATENT DOCUMENTS

| | | | |
|---|---|---|---|
| 9,057,852 B2 | 6/2015 | Morioka et al. | |
| 9,244,234 B2 * | 1/2016 | Tanazawa | G02B 27/143 |
| 2014/0133802 A1 * | 5/2014 | Morioka | G02B 6/4286 385/33 |
| 2014/0328558 A1 * | 11/2014 | Morioka | G02B 6/4286 385/33 |
| 2015/0010272 A1 * | 1/2015 | Tanazawa | G02B 6/4286 385/31 |
| 2015/0086165 A1 * | 3/2015 | Morioka | G02B 6/4286 385/93 |

* cited by examiner

OPTICAL RECEPTACLE AND OPTICAL MODULE

TECHNICAL FIELD

The present invention relates to an optical receptacle to which an optical transmission member is connected, and to an optical module.

BACKGROUND ART

Conventionally, in optical communications using an optical transmission member such as optical fibers or optical waveguides, an optical module having a light emitting element such as a surface-emitting laser (for example, a VCSEL: Vertical Cavity Surface Emitting Laser) is used. The optical module has an optical receptacle that causes light including communication information emitted from a light emitting element to be incident on an end surface of an optical transmission member.

Some optical modules have a detecting element for monitoring the intensity and amount of light emitted from the light emitting element for the purpose of stabilizing output characteristics of the light emitting element against temperature changes and of adjusting the light output.

For example, in PTL 1 an optical module is disclosed which has a photoelectric conversion device in which a light emitting element and a detecting element are disposed, and an optical receptacle that optically connects the light emitting element and an end surface of an optical transmission member.

FIG. 1 is a cross-sectional view that schematically illustrates the configuration of optical module 10 disclosed in PTL 1. As illustrated in FIG. 1, optical module 10 disclosed in PTL 1 includes photoelectric conversion device 20 and optical receptacle 30 made of resin. Optical receptacle 30 includes: first optical surface 31 that allows light emitted from light emitting element 21 to be incident thereon; second optical surface 32 that emits light that passes through the inside thereof so that the light concentrates at end surface 23 of optical transmission member 22; reflecting surface 33 that reflects the light incident on first optical surface 31 to the side of optical transmission member 22; light separating section 34 that separates the light reflected by reflecting surface 33 into monitoring light Lm directed toward the side of detecting element 24, and signal light Ls directed toward the side of optical transmission member 22; and third optical surface 35 that emits monitoring light Lm toward detecting element 24. Light separating section 34 is formed as one part of an inner face of recess 36 that is formed in optical receptacle 30.

In optical module 10 disclosed in PTL 1, the light emitted from light emitting element 21 and incident on first optical surface 31 is reflected by reflecting surface 33 toward light separating section 34. The light reflected by reflecting surface 33 is separated into signal light Ls and monitoring light Lm by light separating section 34. Monitoring light Lm separated by light separating section 34 is emitted from third optical surface 35 toward a light receiving surface of detecting element 24. On the other hand, signal light Ls separated by light separating section 34 passes through light separating section 34 and is emitted to outside of optical receptacle 30. Signal light Ls is then incident again on optical receptacle 30 from incidence surface 37 that is another part of the inner face of recess 36. Signal light Ls incident on incidence surface 37 is emitted from second optical surface 32 toward end surface 23 of optical transmission member 22.

CITATION LIST

Patent Literature

PTL 1
Japanese Patent Application Laid-Open No. 2013-137507

SUMMARY OF INVENTION

Technical Problem

However, in optical module 10 disclosed in PTL 1, the light emitted from light emitting element 21 passes through a plurality of interfaces between optical receptacle 30 (resin) and air and arrives at optical transmission member 22. At this time, part of the light emitted from light emitting element 21 is reflected at the interfaces. Further, since light that moves forth inside optical receptacle 30 is absorbed little by little by the resin constituting optical receptacle 30, if the optical path of signal light Ls inside optical receptacle 30 is long, loss of signal light Ls becomes a problem. Hence, with respect to optical module 10 according to PTL 1, there is room to improve the use efficiency of light emitted from light emitting element 21.

It is therefore an object of the present invention to provide an optical receptacle that can improve the use efficiency of light emitted from a light emitting element. A further object of the present invention is to provide an optical module having the aforementioned optical receptacle.

Solution to Problem

An optical receptacle according to one aspect of the present invention is to be disposed between a photoelectric conversion device and one or more optical transmission members, the photoelectric conversion device including one or more photoelectric conversion elements and one or more detecting elements for monitoring emittance light emitted from the photoelectric conversion element, the optical receptacle being used for optically coupling the photoelectric conversion element and an end surface of the optical transmission member, the optical receptacle including: one or more first optical surfaces that allow emittance light emitted from the photoelectric conversion element to be incident thereon, or that cause reception light emitted from the end surface of the optical transmission member and passing through inside to be emitted toward the photoelectric conversion element; one or more second optical surfaces that cause emittance light incident on the first optical surface to be emitted toward the end surface of the optical transmission member, or allow reception light emitted from the end surface of the optical transmission member to be incident thereon; a light separating section disposed on an optical path of light between the first optical surface and the second optical surface, the light separating section separating emittance light incident on the first optical surface into monitoring light directed toward the detecting element and signal light directed toward the end surface of the optical transmission member, or the light separating section causing at least one part of reception light incident on the second optical surface to be reflected toward the first optical surface side; and one or more third optical surfaces that cause the monitoring light separated by the light separating section to be emitted toward the detecting element; in which: the light separating section includes a plurality of separating units that each include: a first divided reflecting surface that is an inclining surface with respect to an optical axis of emittance light incident on the first optical surface, and a second divided reflecting surface that is an inclining surface inclined at a different angle to the first divided reflecting surface with respect to the optical axis of the emittance light; the first divided reflecting surface internally reflects a part of emittance light incident on the first optical surface toward the second optical surface side as the signal light, or internally reflects a part of reception light incident on the second optical surface toward the first optical surface side; the second divided reflecting surface internally reflects a part of emittance light incident on the first optical surface as the monitoring light; and an entire optical path between the first optical surface, the light separating section and the second optical surface is located inside the optical receptacle.

Further, an optical module according to one aspect of the present invention includes: a photoelectric conversion device including a substrate, one or more photoelectric conversion elements disposed on the substrate, and one or more detecting elements disposed on the substrate for monitoring emittance light emitted from the photoelectric conversion element; and the optical receptacle according to the present invention.

Advantageous Effects of Invention

According to the present invention, an optical receptacle and optical module can be provided that are excellent with respect to the use efficiency of light emitted from a light emitting element.

DESCRIPTION OF EMBODIMENTS

Embodiments of the present invention will be described in detail with reference to the accompanying drawings.

Embodiment 1

(Configuration of Optical Module)

Figure 2:
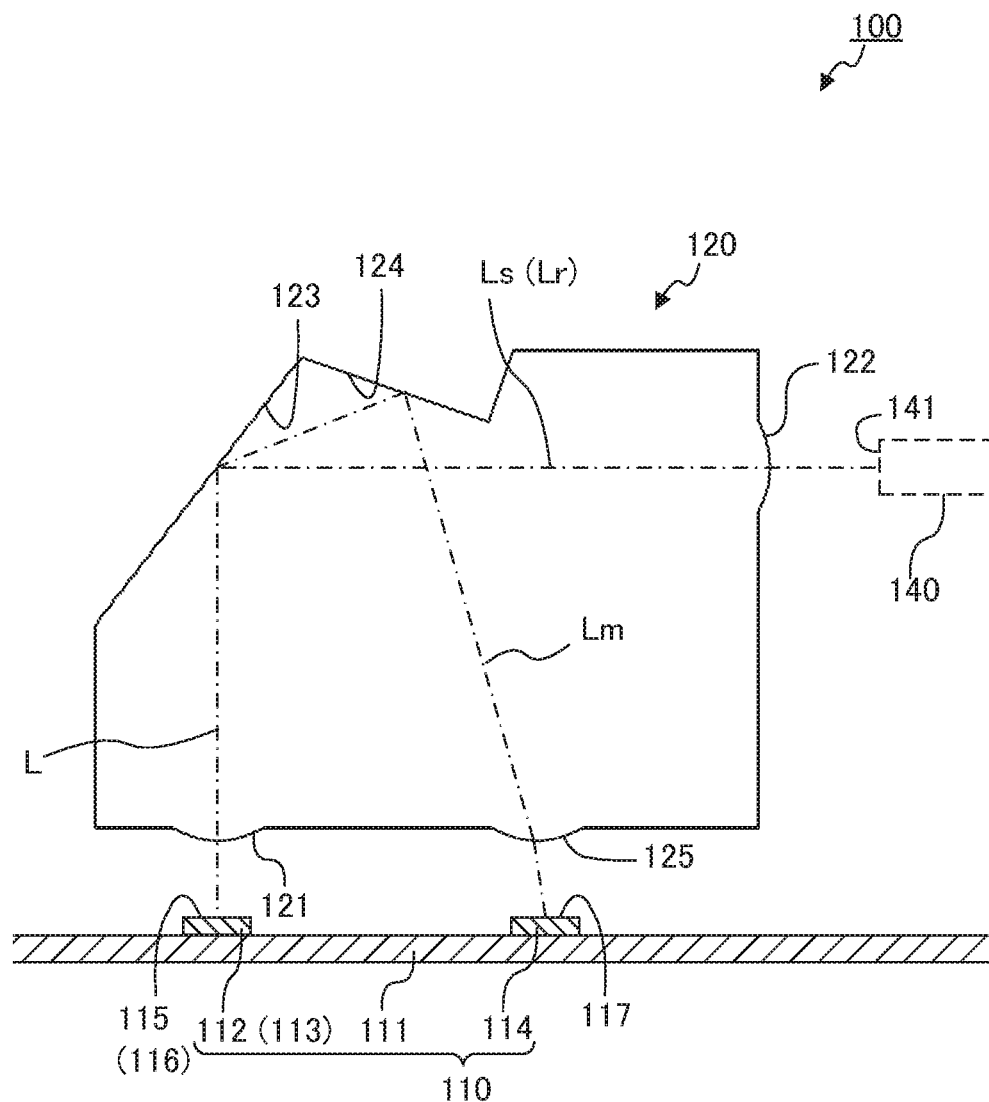
FIG. 2 is a cross-sectional view of an optical module according to Embodiment 1.
Figure 3A:
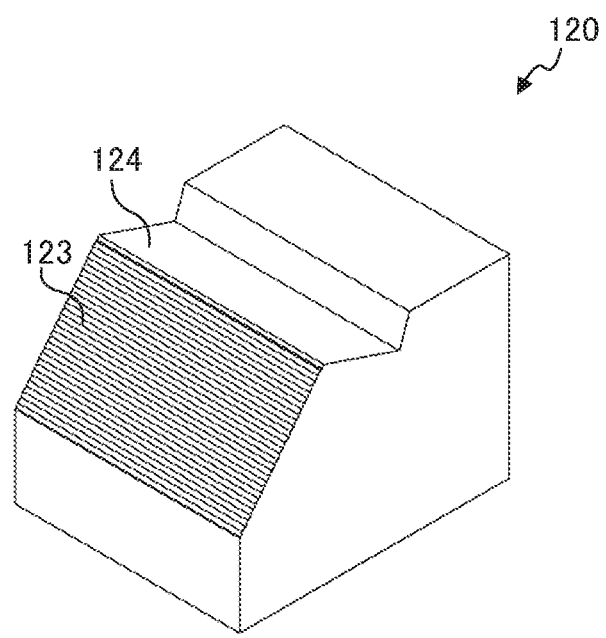
FIGS. 3A and 3B are perspective views of an optical receptacle according to Embodiment 1.
Figure 3B:
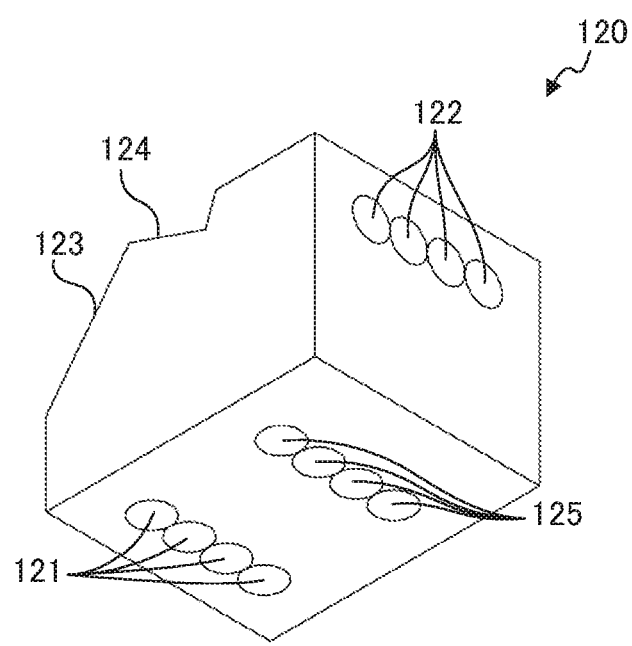

FIG. 2 is a cross-sectional view of optical module 100 according to an embodiment of the present invention. In FIG. 2, hatching of a cross-section of optical receptacle 120 is omitted in order to illustrate optical paths inside optical receptacle 120. Further, an alternate long and short dash line in FIG. 2 indicates an optical axis of light.

As illustrated in FIG. 2, optical module 100 has substrate-mounted photoelectric conversion device 110 including a photoelectric conversion element (light emitting element 112 and/or light receiving element 113), and optical receptacle 120. Optical module 100 is used in a state in which optical transmission member 140 is connected to optical receptacle 120 through a ferrule.

The kind of optical transmission member 140 is not particularly limited, and the kinds thereof include an optical fiber and an optical waveguide. In the present embodiment, optical transmission member 140 is an optical fiber. The optical fiber may be a single-mode optical fiber or a multi-mode optical fiber. The number of optical transmission members 140 is not particularly limited. In the present embodiment, four optical fibers are arranged in one row at fixed intervals. Note that optical transmission members 140 may be arranged in two or more rows.

Photoelectric conversion device 110 has substrate 111, light emitting element 112 and/or light receiving element 113, and detecting element 114. In optical module 100 used for transmitting, light emitting element 112 is used as a photoelectric conversion element. In optical module 100 used for receiving, light receiving element 113 is used as a photoelectric conversion element. In addition, in optical module 100 used for transmitting and receiving, light emitting element 112 and light receiving element 113 are used as photoelectric conversion elements. In the present embodiment, optical module 100 used for transmitting and receiving is described.

Substrate 111 is, for example, a glass composite substrate, a glass epoxy substrate or a flexible substrate. Light emitting element 112, light receiving element 113 and detecting element 114 are disposed on substrate 111.

Light emitting element 112 is disposed on substrate 111 and emits laser light (emittance light L) in a perpendicular direction with respect to a surface of substrate 111 on which light emitting element 112 is disposed. The number of light emitting elements 112 is not particularly limited. In the present embodiment the number of light emitting elements 112 is two. The positions of light emitting element 112 are also not particularly limited. In the present embodiment, the two light emitting elements 112 are arranged at regular intervals along the arrangement direction of optical transmission members 140. Light emitting element 112 is, for example, a vertical cavity surface emitting laser (VCSEL). In a case where optical transmission members 140 are arranged in two or more rows, light emitting elements 112 may also be arranged in the same number of rows.

Figure 7A:
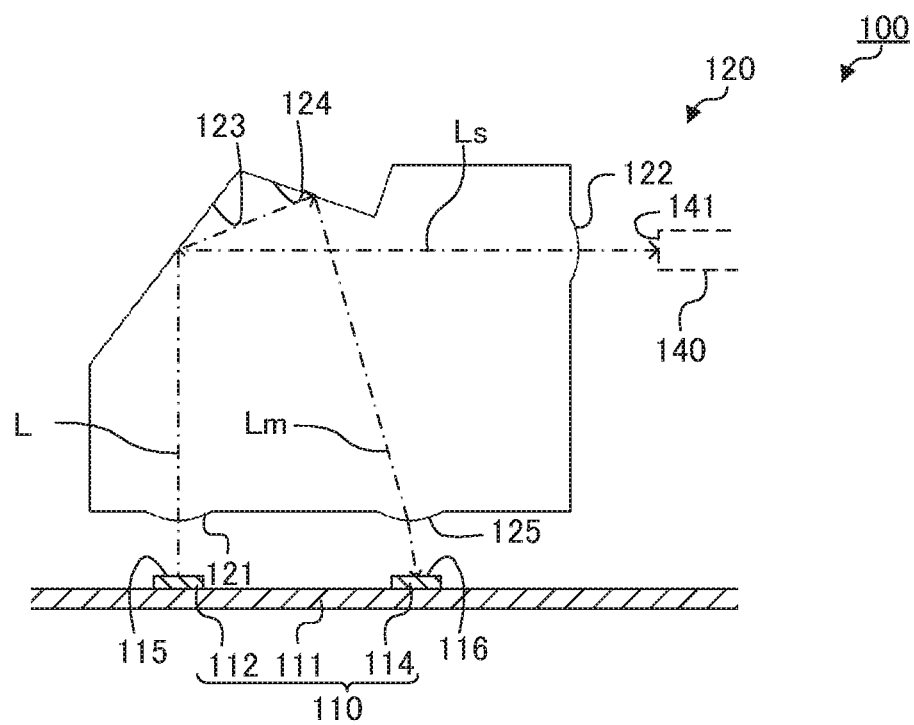
FIGS. 7A and 7B are views of an optical path in the optical module according to Embodiment 1.
Figure 7B:
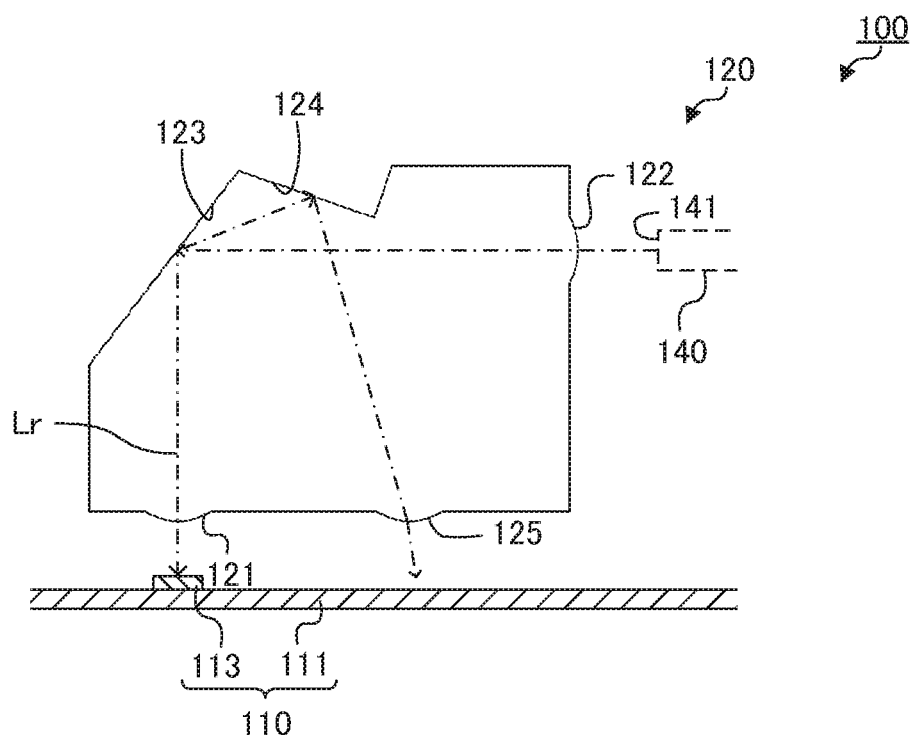

Light receiving element 113 is disposed on substrate 111, and receives at least one part of reception light Lr emitted from optical transmission member 140 (see FIG. 7B). The number of light receiving elements 113 is not particularly limited. In the present embodiment the number of light receiving elements 113 is two. The positions of light receiving elements 113 are also not particularly limited. In the present embodiment the two light receiving elements 113 are arranged in one row at regular intervals along the arrangement direction of optical transmission members 140. Specifically, the two light receiving elements 113 are arranged so as to be positioned on the same straight line as the two light emitting elements 112. Light receiving element 113 is, for example, a photodetector. In a case where optical transmission members 140 are arranged in two or more rows, light receiving elements 113 may also be arranged in the same number of rows.

Detecting element 114 is disposed on substrate 111, and receives monitoring light Lm for monitoring an output (for example, the intensity or amount of light) of emittance light L emitted from light emitting element 112. Detecting element 114 is, for example, a photodetector. In the present embodiment, when optical module 100 is seen in a planar view, detecting element 114 is disposed between light emitting element 112 and light receiving element 113, and optical transmission member 140. The number of detecting elements 114 is not particularly limited. In the present embodiment the number of detecting elements 114 is two. The two detecting elements 114 are arranged in one row at a predetermined interval in correspondence with the two light emitting elements 112. In a case where light emitting elements 112 are arranged in two or more rows, detecting elements 114 may also be arranged in the same number of rows. Further, from the viewpoint of preventing reflected light from detecting element 114 returning into optical receptacle 120, the optical axis of monitoring light Lm incident on detecting element 114 may be inclined relative to detection surface 117 of detecting element 114.

Optical receptacle 120 is disposed on substrate 111. In a state in which optical receptacle 120 is disposed between photoelectric conversion device 110 and optical transmission member 140, optical receptacle 120 optically couples light emitting surfaces 115 of the plurality of light emitting elements 112 and end surfaces 141 of the plurality of optical transmission members 140, respectively, and optically couples detection surfaces 117 of the plurality of detecting elements 114 and end surfaces 141 of the plurality of optical transmission members 140, respectively. Hereunder, the configuration of optical receptacle 120 is described in detail.

(Configuration of Optical Receptacle)

FIGS. 3 to 6 illustrate the configuration of optical receptacle 120 according to Embodiment 1. FIG. 3A is a perspective view of optical receptacle 120 as seen from above, and FIG. 3B is a perspective view of optical receptacle 120 as seen from below. FIG. 4A is a plan view of optical receptacle 120, FIG. 4B is a bottom surface view, FIG. 4C is a front view, and FIG. 4D is a side view. FIG. 5A is a perspective view of light separating section 123, and FIG. 5B illustrates the positional relation between faces constituting light separating section 123. FIG. 6A is a partially enlarged cross-sectional view of a portion indicated by a dashed line in FIG. 4D. FIG. 6B is a view for describing a light amount ratio between signal light Ls and monitoring light Lm.

As illustrated in FIG. 2, FIGS. 3A and 3B and FIGS. 4A to 4D, optical receptacle 120 is an approximately rectangular parallelepiped shaped member. Optical receptacle 120 has light transmitting properties, and causes light that is a part of emittance light L emitted from light emitting surface 115 of light emitting element 112 to be emitted toward end surface 141 of optical transmission member 140, and on the other hand causes light that is a part of reception light Lr emitted from optical transmission member 140 to be emitted toward light receiving surface 116 of light receiving element 113. Optical receptacle 120 has a plurality of first optical surfaces 121, a plurality of second optical surfaces 122, light separating section 123, reflecting surface 124 and a plurality of third optical surfaces 125. Optical receptacle 120 is formed using a material having light transmitting properties with respect to light of a wavelength used for optical communication. Examples of such a material include a transparent resin such as polyetherimide (PEI) and a cyclic olefin resin.

First optical surface 121 is an optical surface that causes emittance light L emitted from light emitting element 112 to enter optical receptacle 120 while refracting emittance light L. Further, first optical surface 121 is also an optical surface that causes reception light Lr from optical transmission member 140 that has moved forth through inside of optical receptacle 120 to be emitted toward light receiving element 113 while refracting reception light Lr. In the present embodiment, the shape of first optical surface 121 is a convex lens surface which is convex toward light emitting element 112 (light receiving element 113). First optical surface 121 converts emittance light L emitted from light emitting element 112 into collimated light. Further, first optical surface 121 converges collimated light (reception light Lr) that has moved forth through inside of optical receptacle 120. In the present embodiment, the plurality of (four) first optical surfaces 121 are arranged on the bottom surface of optical receptacle 120 in one row along the arrangement direction of optical transmission members 140 so as to face light emitting surfaces 115 of light emitting elements 112 and light receiving surfaces of light receiving elements 113, respectively. Further, the shape in a planar view of first optical surface 121 is circular. The central axis of first optical surface 121 is preferably perpendicular to light emitting surface 115 of light emitting element 112 and light receiving surface 116 of light receiving element 113. Further, the central axis of first optical surface 121 preferably matches the optical axis of light L (reception light Lr incident on light receiving element 113) emitted from light emitting element 112.

Light incident on first optical surface 121 moves forth toward light separating section 123. Further, reception light Lr emitted from first optical surface 121 moves forth toward light receiving element 113. Note that, in a case where light emitting elements 112 and light receiving elements 113 are arranged in two or more rows, first optical surfaces 121 are also arranged in the same number of rows.

Figure 4A:
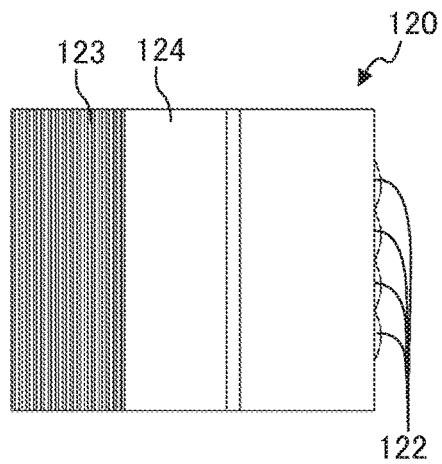
FIGS. 4A to 4D illustrate the configuration of the optical receptacle according to Embodiment 1.
Figure 4B:
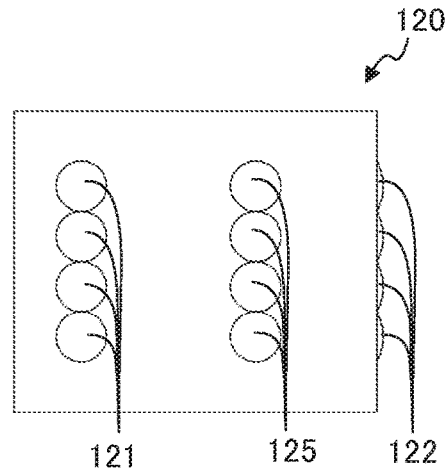

In the present embodiment, as illustrated in FIG. 4B, among the four first optical surfaces 121, two first optical surfaces 121 on the upper side in the diagrammatic representation are used as first optical surfaces 121 on a transmission side, and two first optical surfaces 121 on the lower side are used as first optical surfaces 121 on a reception side. Specifically, emittance light L from light emitting elements 112 is incident on the two first optical surfaces 121 on the transmission side which are on the upper side in the diagrammatic representation, and reception light Lr that moved forth through the inside of optical receptacle 120 is emitted from the two first optical surfaces 121 on the reception side which are on the lower side in the diagrammatic representation. Thus, in the optical receptacle 120 according to the present embodiment, the four first optical surfaces 121 are equally divided into two regions by taking a plane perpendicular to substrate 111 as the center of the four first optical surfaces 121, with one of the regions functioning as the transmission side and the other region functioning as the reception side.

Light separating section 123 is disposed on an optical path between first optical surface 121 and second optical surface 122, and separates emittance light L incident on first optical surface 121 into signal light Ls directed toward end surface 141 side of optical transmission member 140, and monitoring light Lm directed toward detecting element 114 side. Further, light separating section 123 causes at least one part of reception light Lr incident on second optical surface 122 to be reflected to light receiving element 113 side.

Figure 5A:
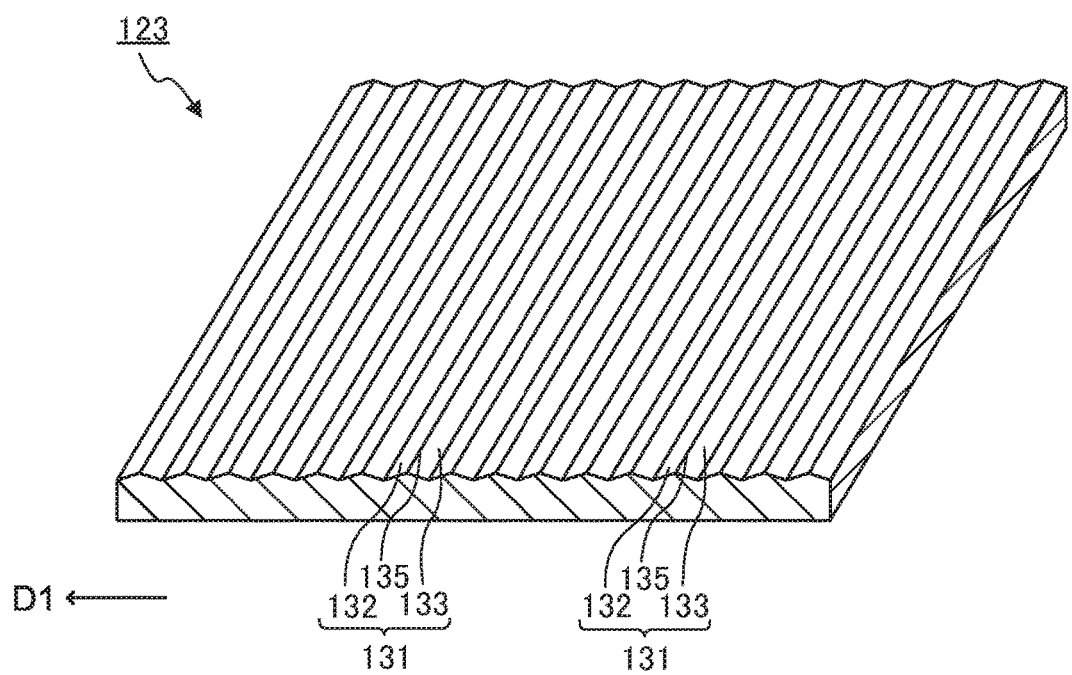
FIGS. 5A and 5B illustrate the configuration of a light separating section according to Embodiment 1.
Figure 5B:
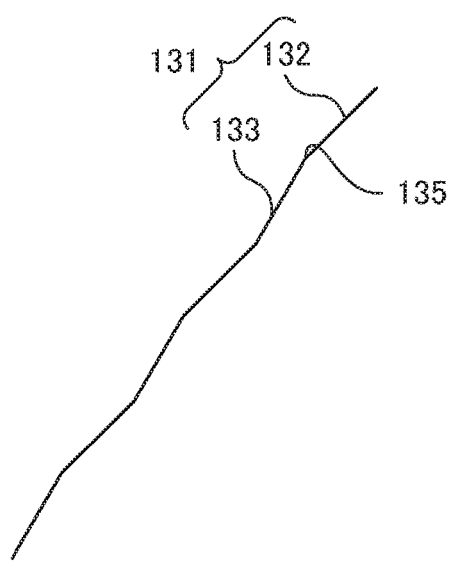

As illustrated in FIGS. 5A and 5B, light separating section 123 has a plurality of separating units 131. The number of separating units 131 is not particularly limited. Each separating unit 131 includes first divided reflecting surface 132 and second divided reflecting surface 133, respectively. Specifically, light separating section 123 has a plurality of first divided reflecting surfaces 132 and a plurality of second divided reflecting surfaces 133. The arrangement direction of separating units 131 is not particularly limited, and separating units 131 may be arranged in the inclination direction (first direction D1) of first divided reflecting surface 132 (second divided reflecting surface 133) or may be arranged in a second direction that is perpendicular to first direction D1. In the present embodiment, separating units 131 are arranged in first direction D1. Ridge line 135 is formed between first divided reflecting surface 132 and second divided reflecting surface 133. In the present embodiment, a plurality of ridge lines 135 that are adjacent in first direction D1 are disposed in parallel with each other.

First divided reflecting surface 132 is an inclining surface with respect to the optical axis of emittance light L incident on first optical surface 121. First divided reflecting surface 132 is also an inclining surface with respect to the optical axis of reception light Lr incident on second optical surface 122 (see FIG. 7B). In the present embodiment, first divided reflecting surface 132 inclines so as to progressively move away from second optical surface 122 (optical transmission member 140) as first divided reflecting surface 132 approaches the bottom surface of optical receptacle 120 from the upper surface thereof. First divided reflecting surface 132 causes light that is a part of emittance light L incident on first optical surface 121 to be internally reflected toward the side of second optical surface 122. Further, first divided reflecting surface 132 causes light that is a part of reception light Lr incident on second optical surface 122 to be internally reflected toward the side of first optical surface 121. The inclination angle of first divided reflecting surface 132 is not particularly limited as long as first divided reflecting surface 132 can exert the aforementioned functions. In the present embodiment, the inclination angle of first divided reflecting surface 132 is 45° with respect to the optical axis of emittance light L incident on first optical surface 121 and the optical axis of reception light Lr incident on second optical surface 122. First divided reflecting surfaces 132 are divided in first direction D1, and disposed at predetermined intervals.

Second divided reflecting surface 133 is an inclining surface inclined at an angle that is different to the inclination angle of first divided reflecting surface 132 with respect to the optical axis of emittance light L incident on first optical surface 121. In the present embodiment, second divided reflecting surface 133 inclines so as to progressively approach second optical surface 122 (optical transmission member 140) as second divided reflecting surface 133 approaches the bottom surface of optical receptacle 120 from the upper surface thereof. Second divided reflecting surface 133 internally reflects light that is a part of emittance light L incident on first optical surface 121, as monitoring light Lm. The inclination angle of second divided reflecting surface 133 is not particularly limited as long as second divided reflecting surface 133 can exert the aforementioned function. In the present embodiment, the inclination angle of second divided reflecting surface 133 is 38.5° with respect to the optical axis of light L incident on first optical surface 121. Further, second divided reflecting surfaces 133 are divided in first direction D1, and disposed at predetermined intervals.

Figure 6A:
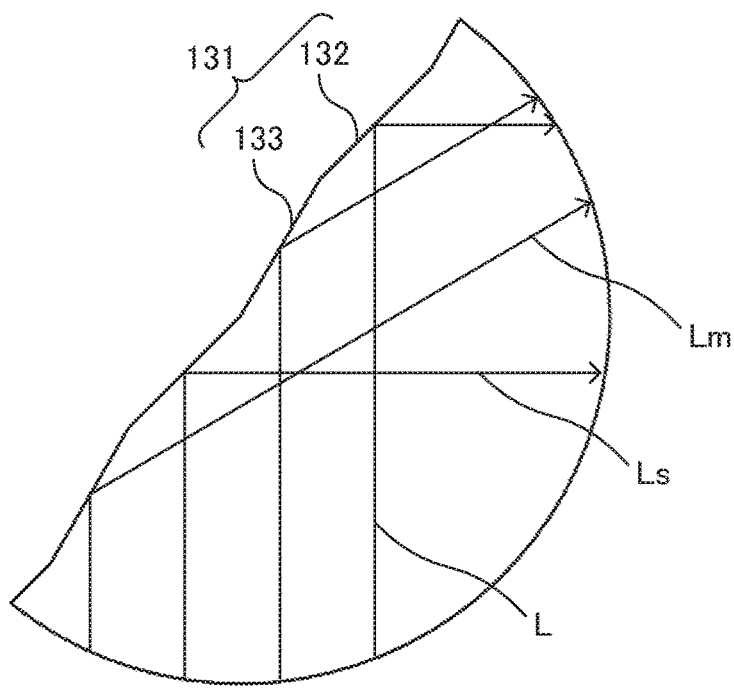
FIGS. 6A and 6B illustrate the configuration of the light separating section according to Embodiment 1.

As illustrated in FIG. 6A, light that is a part of emittance light L incident on first optical surface 121 is internally incident on first divided reflecting surface 132 at an incidence angle greater than a critical angle. First divided reflecting surface 132 internally reflects the light that is a part of light L incident on first optical surface 121 toward the side of second optical surface 122 to generate signal light Ls. Further, although not illustrated in particular in the drawings, light that is a part of reception light Lr incident on second optical surface 122 is also internally incident on first divided reflecting surface 132 at an incidence angle greater than the critical angle. At this time, the light that is a part of emittance light L incident on first optical surface 121 is internally reflected at first divided reflecting surface 132 so as change by 90° with respect to the traveling direction of the emittance light L incident on first optical surface 121. First divided reflecting surface 132 internally reflects the light that is a part of reception light Lr incident on second optical surface 122 toward the side of first optical surface 121.

Further, light that is a part of emittance light L incident on first optical surface 121 is internally incident on second divided reflecting surface 133 at an incidence angle greater than the critical angle. Second divided reflecting surface 133 internally reflects the light that is a part of emittance light L incident on first optical surface 121 to generate monitoring light Lm. At this time, light that is another part of emittance light L incident on first optical surface 121 is internally reflected so as to move forth to the upper surface side more than signal light Ls reflected at first divided reflecting surface 132.

Figure 6B:
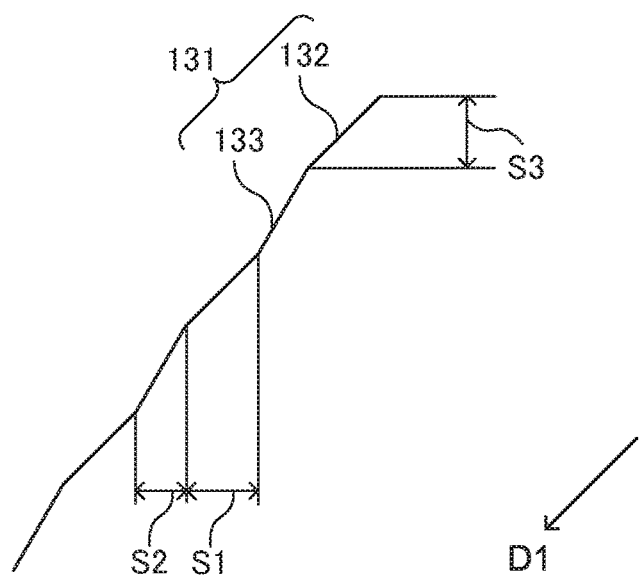

The light amount ratio between signal light Ls and monitoring light Lm is not particularly limited as long as monitoring light Lm can be obtained that can monitor the intensity and amount of light of light L emitted from light emitting element 112 while obtaining a desired amount of signal light Ls. As illustrated in FIG. 6B, the light amount ratio between signal light Ls and monitoring light Lm is the same as an area ratio between area S1 of first divided reflecting surface 132 and area S2 of second divided reflecting surface 133 when viewed from first optical surface 121. The light amount ratio between signal light Ls and monitoring light Lm is preferably a ratio of signal light Ls:monitoring light Lm of 6:4 to 8:2, and more preferably is a ratio of signal light Ls:monitoring light Lm of 7:3. The light amount ratio between signal light Ls and monitoring light Lm can be adjusted by changing the area ratio between area S1 of first divided reflecting surface 132 and area S2 of second divided reflecting surface 133 when viewed from first optical surface 121. Further, the amount of reception light Lr is not particularly limited as long as a desired amount of light can be obtained. As illustrated in FIG. 6B, the amount of reception light Lr depends on area S3 of first divided reflecting surface 132 when viewed from second optical surface 122.

Second optical surface 122 is an optical surface that emits toward end surface 141 of optical transmission member 140 signal light Ls incident on first optical surface 121 and reflected by first divided reflecting surface 132. Further, second optical surface 122 is also an optical surface that causes reception light Lr emitted from end surface 141 of optical transmission member 140 to enter optical receptacle 120 while refracting reception light Lr. In the present embodiment, second optical surface 122 has a shape of a convex lens surface which is convex toward end surface 141 of optical transmission member 140. Second optical surface 122 causes emittance light L that has moved forth through the inside of optical receptacle 120 to converge toward end surface 141 of optical transmission member 140, and also converts reception light Lr emitted from end surface 141 of optical transmission member 140 into collimated light. In the present embodiment, the plurality of (four) second optical surfaces 122 are arranged in one row along the arrangement direction of optical transmission member 140 so as to face end surfaces 141 of optical transmission members 140, respectively, at the front of optical receptacle 120. The shape in a planar view of second optical surface 122 is circular. Preferably, the central axis of second optical surface 122 is perpendicular to end surface 141 of optical transmission member 140. Further, the central axis of second optical surface 122 preferably matches the optical axis of reception light Lr emitted from optical transmission member 140. Note that in a case where optical transmission members 140 are arranged in two or more rows, second optical surfaces 122 are also arranged in the same number of rows.

Figure 4C:
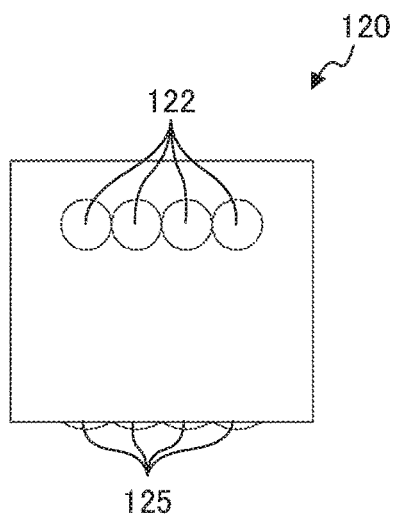
Figure 4D:
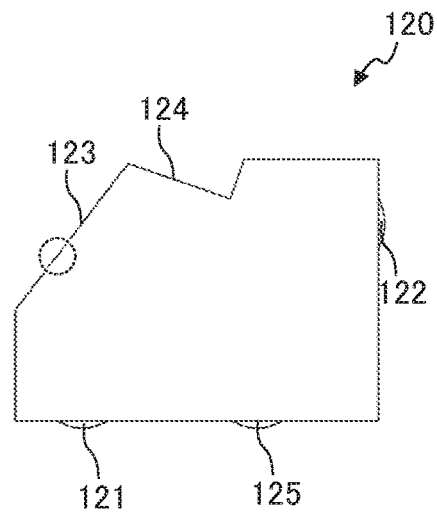

In the present embodiment, as illustrated in FIG. 4C, among the four second optical surfaces 122, two second optical surfaces 122 on the left side in the diagrammatic representation are used as second optical surfaces 122 on a transmission side, and two second optical surfaces 122 on the right side are used as second optical surfaces 122 on a reception side. Specifically, signal light Ls that moved forth through inside of optical receptacle 120 is emitted from the two second optical surfaces 122 on the transmission side that are on the left side in the diagrammatic representation, and reception light Lr emitted from optical transmission members 140 is incident on the two second optical surfaces 122 on the reception side that are on the right side in the diagrammatic representation.

Reflecting surface 124 is disposed on the upper surface side of optical receptacle 120, and internally reflects monitoring light Lm reflected at second divided reflecting surface 133, to the side of third optical surface 125. In the present embodiment, reflecting surface 124 inclines so as to progressively approach second optical surface 122 (optical transmission member 140) as reflecting surface 124 approaches the bottom surface of optical receptacle 120 from the upper surface thereof. The inclination angle of reflecting surface 124 is not particularly limited as long as reflecting surface 124 can exert the aforementioned function.

Third optical surface 125 is disposed on the bottom surface of optical receptacle 120. Third optical surface 125 converges monitoring light Lm separated at light separating section 123 and reflected at reflecting surface 124, and emits the converged monitoring light Lm toward detecting elements 114. In the present embodiment, third optical surface 125 is a convex lens surface which is convex toward detecting elements 114. Preferably, the central axis of third optical surface 125 inclines relative to light receiving surface 116 (substrate 111) of detecting element 114.

Figure 1:
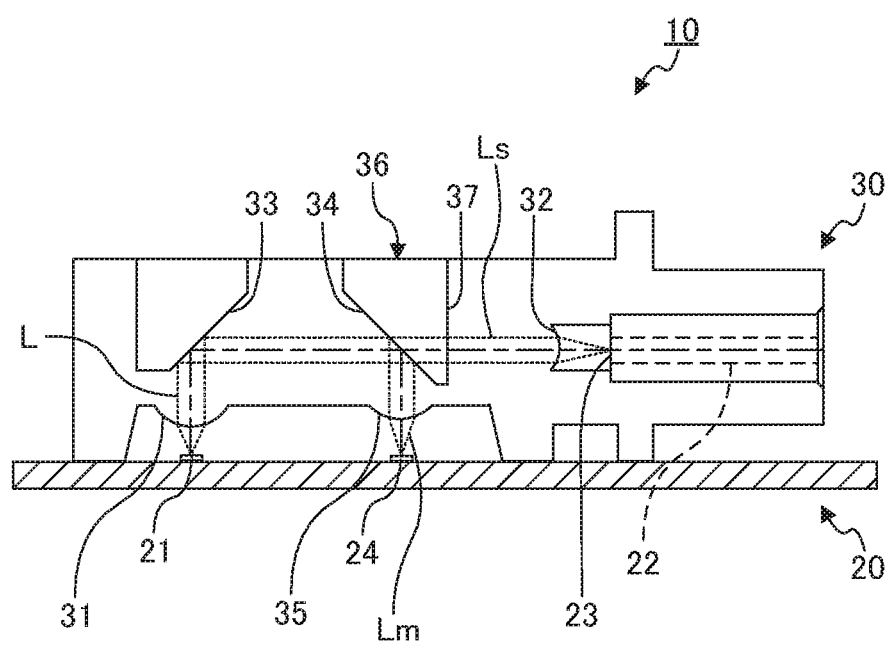
FIG. 1 is a cross-sectional view of an optical module disclosed in PTL 1.

A method for manufacturing optical receptacle 120 is not particularly limited. For example, optical receptacle 120 is manufactured by injection molding. As illustrated in FIG. 2, in optical receptacle 120 according to the present embodiment, in comparison to the conventional optical receptacle 10 (see FIG. 1), since there are fewer faces that are perpendicular to an optical axis of light, mold release can be performed smoothly, the cost of manufacturing a metal mold piece can be reduced, and the cost of manufacturing optical receptacle 120 can also be reduced.

FIGS. 7A and 7B illustrate optical paths in optical module 100. FIG. 7A is a view of optical paths on the transmission side, and FIG. 7B is a view of optical paths on the reception side. In FIGS. 7A and 7B, only the optical axes are illustrated using alternate long and short dash lines.

As illustrated in FIG. 7A, emittance light L emitted from light emitting elements 112 enters optical receptacle 120 at first optical surfaces 121. Light that is one part of the light that enters optical receptacle 120 is internally reflected toward second optical surfaces 122 at first divided reflecting surfaces 132 to become signal light Ls. Signal light Ls reflected at first divided reflecting surfaces 132 is emitted from second optical surfaces 122 and arrives at end surfaces 141 of optical transmission members 140. Thus, light that is one part of emittance light L emitted from light emitting elements 112 passes through first optical surfaces 121, is completely reflected at light separating section 123 (first divided reflecting surfaces 132), and passes through second optical surfaces 122 to arrive at optical transmission members 140. Further, the entire optical path between first optical surface 121, light separating section 123 and second optical surface 122 is located inside optical receptacle 120. On the other hand, light that is another part of emittance light L that enters optical receptacle 120 is internally reflected at second divided reflecting surfaces 133 toward reflecting surface 124 disposed on the upper surface side above signal light Ls to become monitoring light Lm. After being reflected at reflecting surface 124, monitoring light Lm is emitted from third optical surfaces 125 and arrives at detecting elements 114.

Further, as illustrated in FIG. 7B, reception light Lr emitted from optical transmission members 140 enters optical receptacle 120 at second optical surfaces 122. Light that is one part of reception light r that enters optical receptacle 120 is internally reflected toward first optical surfaces 121 by first divided reflecting surfaces 132. Reception light Lr reflected by first divided reflecting surfaces 132 is emitted from first optical surfaces 121 and arrives at light receiving surfaces 116 of light receiving elements 113. Thus, reception light Lr emitted from optical transmission members 140 passes through second optical surfaces 122, is completely reflected at first divided reflecting surfaces 132, and passes through first optical surfaces 121 and arrives at light receiving elements 113. Further, the entire optical path between second optical surface 122, light separating section 123 and first optical surface 121 is located inside optical receptacle 120. Note that, light that is another part of reception light Lr that enters optical receptacle 120 at second optical surfaces 122 is reflected at second divided reflecting surfaces 133, and thereafter is further reflected at reflecting surface 124.

(Modification)

An optical module according to a modification of Embodiment 1 has photoelectric conversion device 110 and optical receptacle 120'. The optical module is used in a state in which optical transmission member 140 is connected through a ferrule to optical receptacle 120'.

Figure 8:
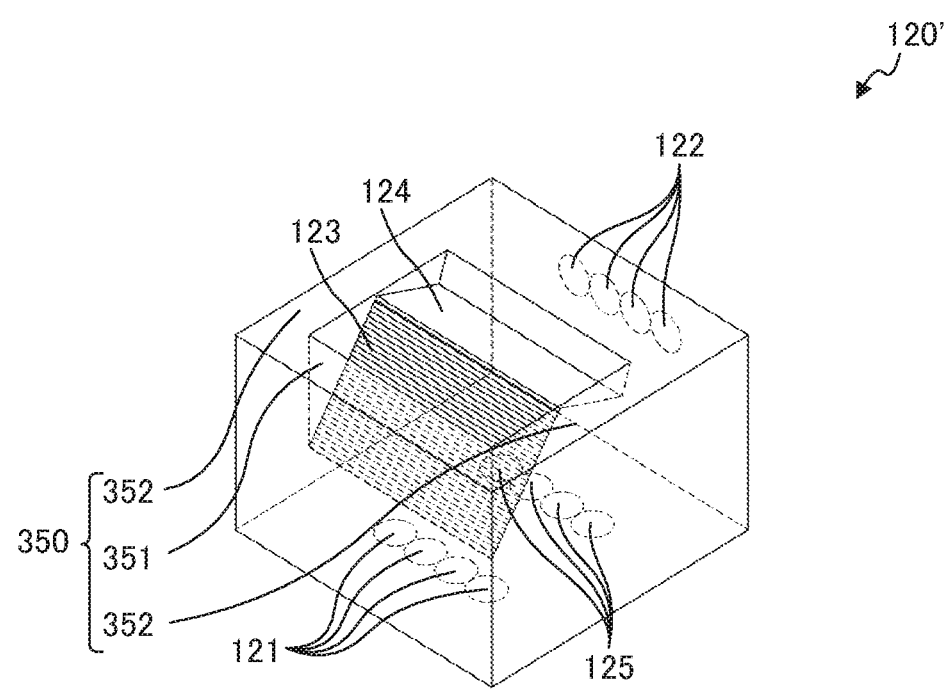
FIG. 8 is a perspective view of an optical receptacle according to a modification of Embodiment 1.

FIG. 8 is a perspective view of optical receptacle 120' according to the modification of Embodiment 1. As illustrated in FIG. 8, optical receptacle 120' according to the modification of Embodiment 1 has a plurality of first optical surfaces 121, a plurality of second optical surfaces 122, light separating section 123, reflecting surface 124, a plurality of third optical surfaces 125 and frame body 350.

Frame body 350 is disposed around light separating section 123 and reflecting surface 124. Frame body 350 has rear wall 351 located on the rear-face side of optical receptacle 120', and side-face walls 352 located at the side-face sides of optical receptacle 120'. The upper surface of frame body 350 is disposed so as to be coplanar with the upper surface of light separating section 123 and reflecting surface 124. By this means, light separating section 123 and reflecting surface 124 can be appropriately protected.

(Effects)

As described above, in optical receptacles 120 and 120' according to Embodiment 1, because emittance light L emitted from light emitting element 112 (light receiving element 113) passes through only first optical surface 121 and second optical surface 122 to reach optical transmission member 140, reflected light reflected at an interface and stray light can be reduced. Therefore, in optical receptacles 120 and 120' according to the present embodiment, the use efficiency of light can be improved in comparison to the conventional optical receptacle (optical receptacle 10 disclosed in PTL 1). Further, in optical receptacles 120 and 120' according to the present embodiment, since an entire optical path between first optical surface 121 and second optical surface 122 is located inside optical receptacle 120, in comparison to optical receptacle 10 disclosed in PTL1, the optical path length between first optical surface 121 and second optical surface 122 can be shortened. Hence, optical receptacles 120 and 120' can be reduced in size (reduced in height).

Further, since light separating section 123 has a plurality of first divided reflecting surfaces 132 and a plurality of second divided reflecting surfaces 133, light emitting surface 115 of light emitting element 112 and end surface 141 of optical transmission member 140 can be optically coupled in an appropriate manner irrespective of the assembling accuracy of light emitting element 112 and optical receptacle 120.

In addition, since first divided reflecting surfaces 132 and second divided reflecting surfaces 133 of light separating section 123 incline relative to a normal line (are not faces along the normal line) with respect to the surface of substrate 111, the manufacturing cost of a metal mold to be used for injection molding can be reduced. Further, manufacturing can be easily performed by injection molding using the metal mold. As a result, the manufacturing cost of optical receptacles 120 and 120' can be reduced.

Note that a reflective film such as a thin film of a metal having high light reflectance (for example, Al, Ag or Au) may be formed on reflecting surface 124, first divided reflecting surfaces 132, and second divided reflecting surfaces 133. In a case where reduction of the number of components is to be prioritized, preferably a configuration that utilizes only a total reflection surface is adopted.

Although optical receptacle 120 for transmitting and receiving has been described in the present embodiment, an optical receptacle of the present invention may also be an optical receptacle for transmitting or may be an optical receptacle for receiving. In the case of an optical receptacle for transmitting, four light emitting elements 112 and four detecting elements 114 are disposed in the optical receptacle. Further, light L emitted from the four light emitting elements 112 is made incident on the four first optical surfaces 121, respectively. Furthermore, four second optical surfaces 122 cause signal light Ls reflected by first divided reflecting surfaces 132 to be emitted toward end surfaces 141 of four optical transmission members 140, respectively. In addition, third optical surfaces 125 emit monitoring light Lm reflected by reflecting surface 124, toward detection surfaces 117 of detecting elements 114, respectively. In the case of an optical receptacle for receiving, four light receiving elements 113 are disposed in the optical receptacle. Reception light Lr emitted from four optical transmission members 140 is made incident four second optical surfaces 122. Further, four first optical surfaces 121 emit reception light Lr reflected by first divided reflecting surfaces 132, toward light receiving surfaces 116 of light receiving elements 113, respectively.

Embodiment 2

In optical module 200 according to Embodiment 2, only the configuration of optical receptacle 220 differs from the configuration of optical module 100 according to Embodiment 1. Therefore, components that are the same as in optical module 100 according to Embodiment 1 are denoted by the same reference numerals and a description of these components is omitted hereunder.

(Configuration of Optical Module)

Figure 9:
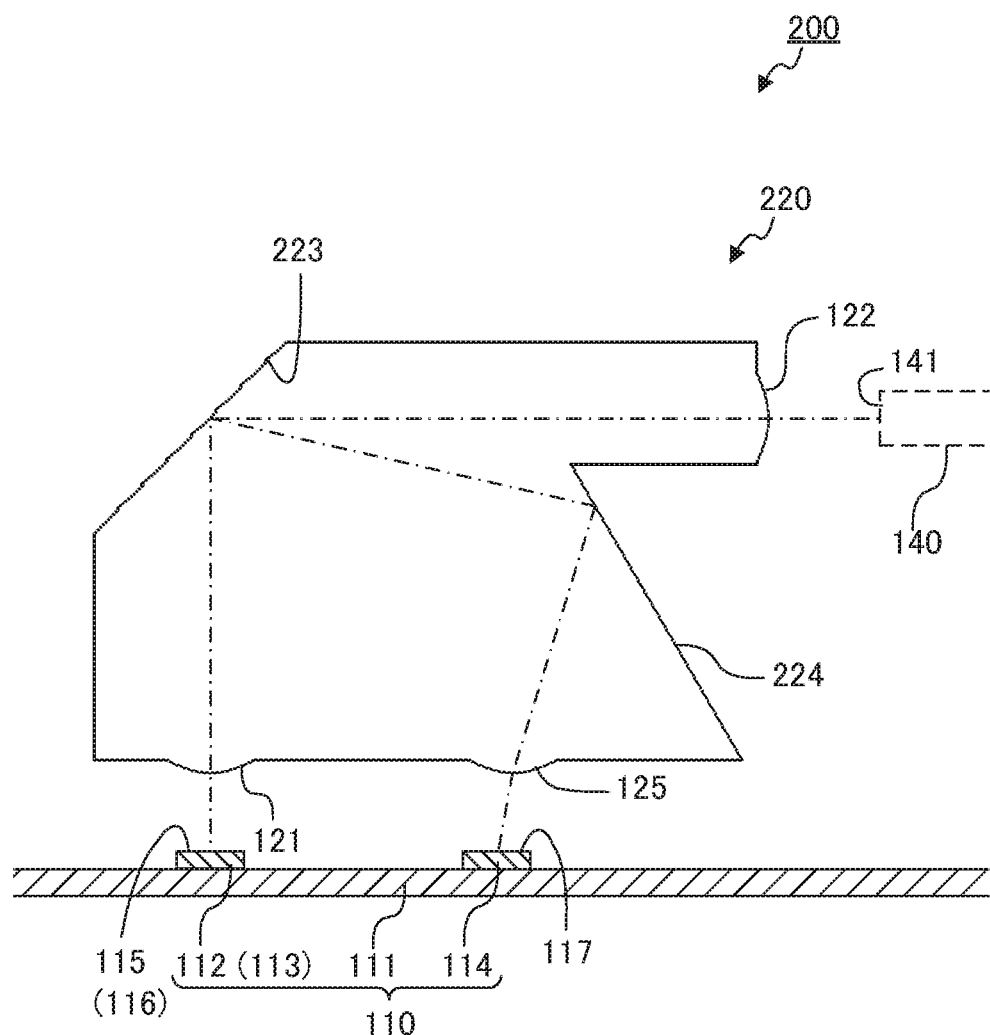
FIG. 9 is a cross-sectional view of an optical module according to Embodiment 2.

FIG. 9 is a cross-sectional view of optical module 200 according to Embodiment 2. In FIG. 9, hatching of a cross-section of optical receptacle 220 is omitted in order to illustrate optical paths inside optical receptacle 220. Further, an alternate long and short dash line in FIG. 9 indicates an optical axis of light.

As illustrated in FIG. 9, optical module 200 has substrate-mounted photoelectric conversion device 110 including a photoelectric conversion element (light emitting element 112 and/or light receiving element 113), and optical receptacle 220. Optical module 200 is used in a state in which optical transmission member 140 is connected to optical receptacle 220 through a ferrule.

(Configuration of Optical Receptacle)

Figure 10A:
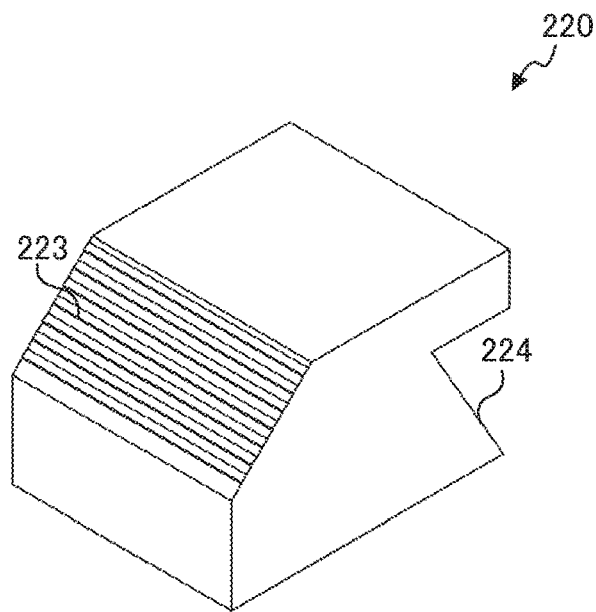
FIGS. 10A and 10B are perspective views of an optical receptacle according to Embodiment 2.
Figure 10B:
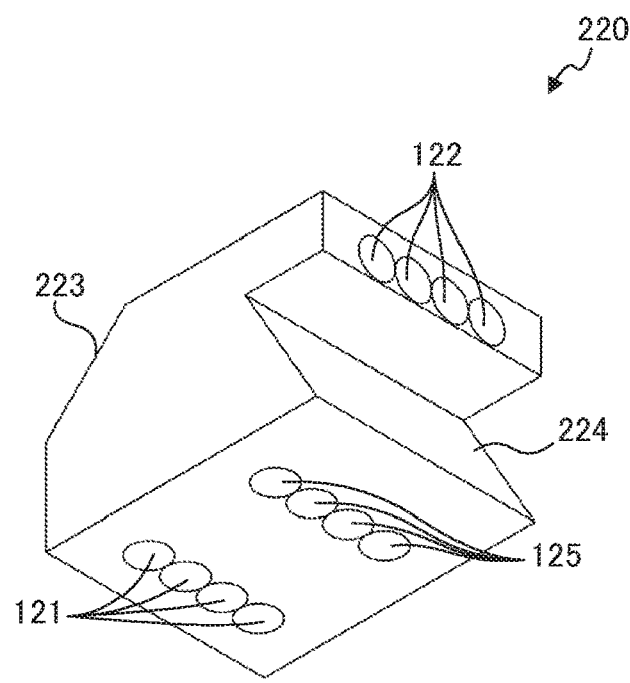
Figure 11A:
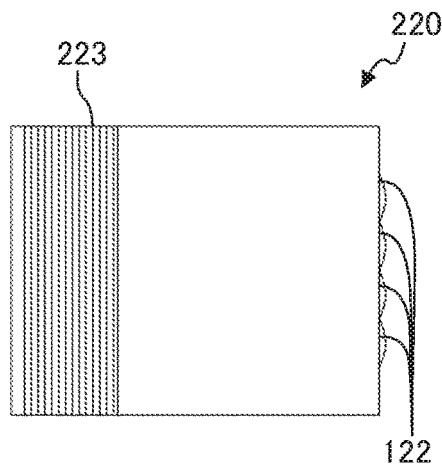
FIGS. 11A to 11D illustrate the configuration of the optical receptacle according to Embodiment 2.
Figure 11B:
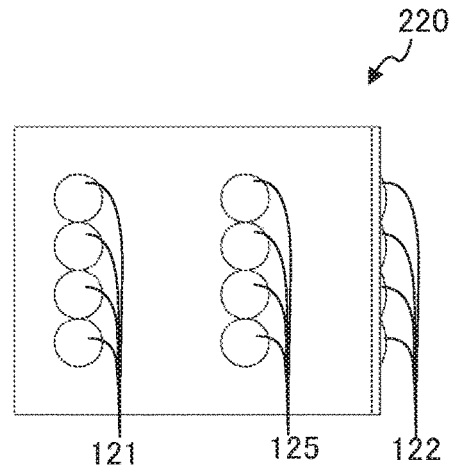
Figure 11C:
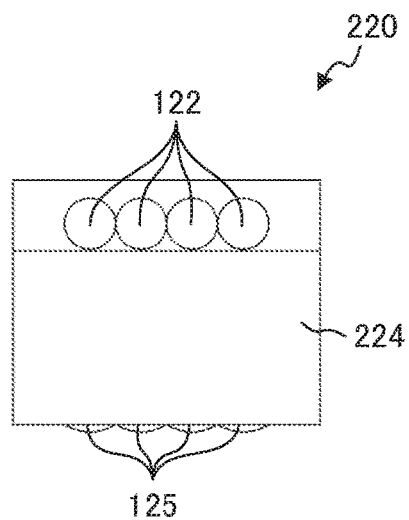
Figure 11D:
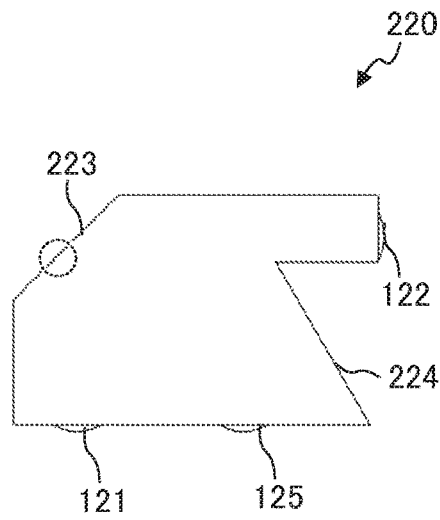
Figure 12A:
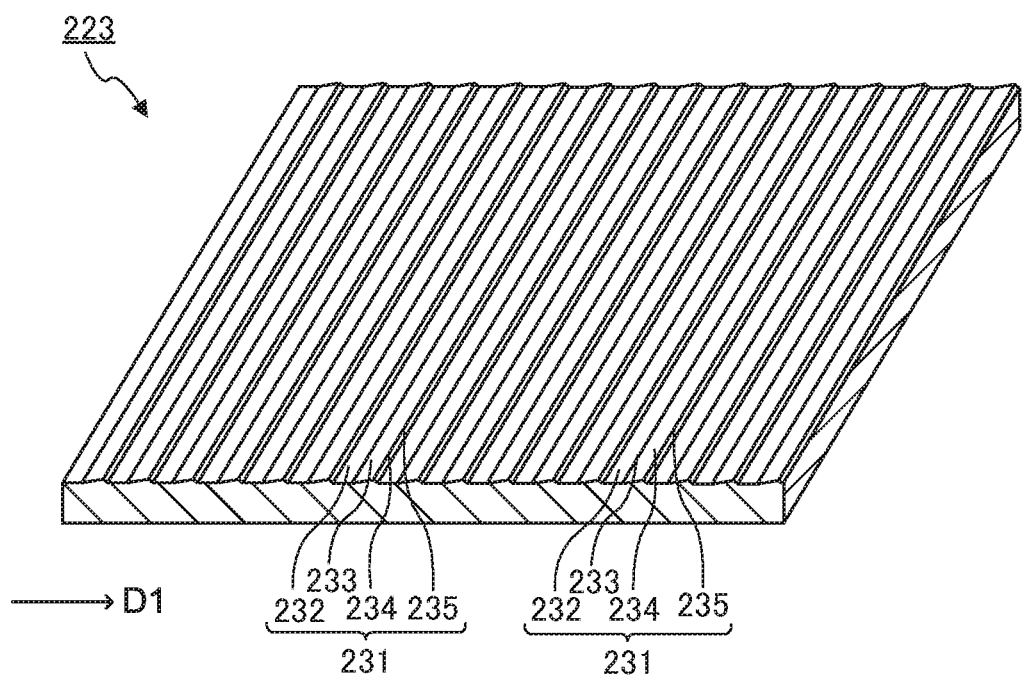
FIGS. 12A and 12B illustrate the configuration of a light separating section according to Embodiment 2.
Figure 12B:
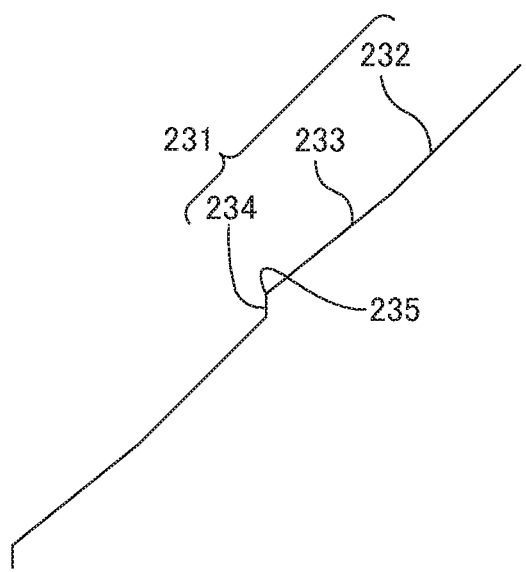
Figure 13:
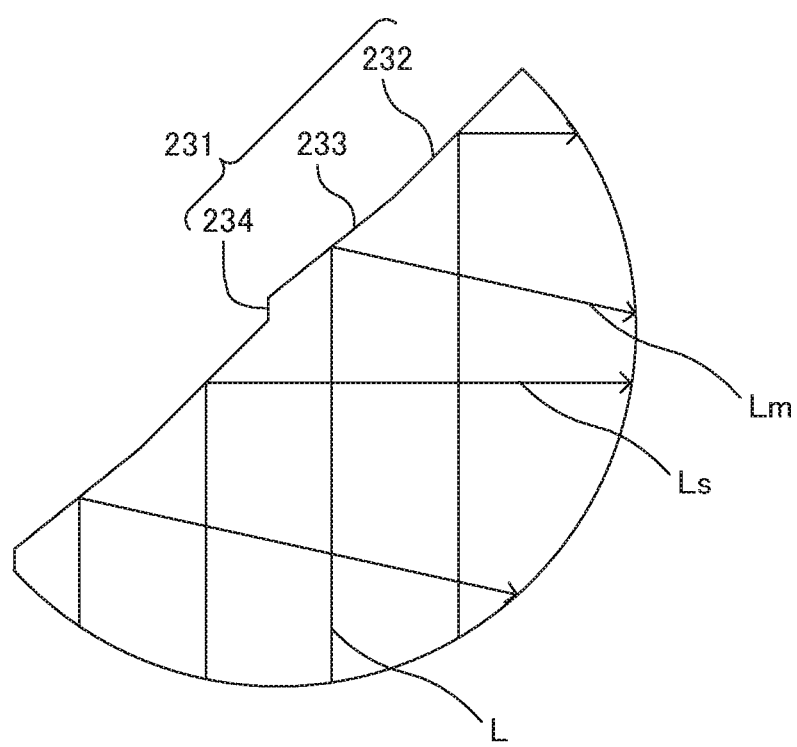
FIG. 13 illustrates the configuration of the light separating section according to Embodiment 2.

FIGS. 10A to 11D illustrate the configuration of optical receptacle 220 according to Embodiment 1. FIG. 10A is a perspective view of optical receptacle 220 as seen from above, and FIG. 10B is a perspective view of optical receptacle 220 as seen from below. FIG. 11A is a plan view of optical receptacle 220, FIG. 11B is a bottom surface view, FIG. 11C is a front view, and FIG. 11D is a side view. FIG. 12A is a perspective view of light separating section 223, and FIG. 12B illustrates the positional relation between faces constituting light separating section 223. FIG. 13 is a partially enlarged cross-sectional view of a portion indicated by a dashed line in FIG. 11D.

As illustrated in FIG. 9, FIGS. 10A and 10B and FIGS. 11A to 11D, optical receptacle 220 has a plurality of first optical surfaces 121, a plurality of second optical surfaces 122, light separating section 223, reflecting surface 224 and a plurality of third optical surfaces 125. Similarly to Embodiment 1, optical receptacle 220 is formed of a transparent resin such as polyetherimide (PEI) or a cyclic olefin resin.

As illustrated in FIGS. 12A and 12B, light separating section 223 according to Embodiment 2 has a plurality of separating units 231. Each separating unit 231 includes first divided reflecting surface 232, second divided reflecting surface 233 and divided connecting surface 234, respectively. Specifically, light separating section 223 has a plurality of first divided reflecting surfaces 232, a plurality of second divided reflecting surfaces 233 and a plurality of divided connecting surfaces 234. The arrangement direction of separating units 231 is not particularly limited, and separating units 231 may be arranged in the inclination direction (first direction D1) of first divided reflecting surface 232 (second divided reflecting surface 233) or may be arranged in a second direction that is perpendicular to first direction D1. In the present embodiment, separating units 231 are arranged in first direction D1. Ridge line 235 is formed between second divided reflecting surface 233 and divided connecting surface 234. In the present embodiment, a plurality of ridge lines 235 that are adjacent in first direction D1 are disposed in parallel with each other.

Second divided reflecting surface 233 is an inclining surface inclined at an angle that is different to the inclination angle of first divided reflecting surface 232 with respect to the optical axis of emittance light L incident on first optical surface 121. Second divided reflecting surface 233 internally reflects light that is a part of emittance light L incident on first optical surface 121, as monitoring light Lm. The inclination angle of second divided reflecting surface 233 is not particularly limited as long as second divided reflecting surface 233 can exert the aforementioned function. In the present embodiment, the inclination angle of second divided reflecting surface 233 is 51° with respect to the optical axis of light L incident on first optical surface 121. Further, second divided reflecting surfaces 233 are divided in first direction D1, and disposed at predetermined intervals. Light that is another part of light L incident on first optical surface 121 is internally reflected so as to move forth to the bottom surface side more than signal light Ls reflected at first divided reflecting surface 232.

Divided connecting surface 234 is a parallel surface with respect to the optical axis of emittance light L incident on first optical surface 121. Divided connecting surface 234 connects first divided reflecting surface 232 and second divided reflecting surface 233 of an adjacent separating unit 231.

As illustrated in FIG. 12B, within a single separating unit 231, first divided reflecting surface 232, second divided reflecting surface 233 and divided connecting surface 234 are arranged in the order mentioned in first direction (direction from the upper surface toward the bottom surface) D1. A smallest angle among angles formed by first divided reflecting surface 232 and second divided reflecting surface 233 is 172°. Note that, optical receptacle 220 in Embodiment 2 need not have divided connecting surfaces 234. In this case, ridge line 235 is formed between second divided reflecting surface 233 and first divided reflecting surface 232 of an adjacent separating unit 231.

As illustrated in FIG. 13, light that is a part of light L incident on first optical surface 121 is internally incident on first divided reflecting surface 232 at an incidence angle greater than a critical angle. First divided reflecting surface 232 internally reflects the light that is a part of light L incident on first optical surface 121 toward the side of second optical surface 122 to generate signal light Ls. Further, although not illustrated in particular in the drawings, light that is a part of light incident on second optical surface 122 is also internally incident on first divided reflecting surface 232 at an incidence angle greater than the critical angle.

Further, light that is a part of emittance light L incident on first optical surface 121 is internally incident on second divided reflecting surface 233 at an incidence angle greater than the critical angle. Second divided reflecting surface 233 internally reflects the light that is a part of emittance light L incident on first optical surface 121 to generate monitoring light Lm. At this time, light that is another part of emittance light L incident on first optical surface 121 is internally reflected so as to move forth to the bottom surface side more than signal light Ls reflected at first divided reflecting surface 232.

Reflecting surface 224 is disposed on the front face side of optical receptacle 220, and internally reflects monitoring light Lm reflected at second divided reflecting surface 233, to the side of third optical surface 125. In the present embodiment, reflecting surface 124 inclines so as to progressively approach second optical surface 122 (optical transmission member 140) as reflecting surface 124 approaches the bottom surface of optical receptacle 220 from the upper surface thereof. The inclination angle of reflecting surface 224 is not particularly limited as long as reflecting surface 224 can exert the aforementioned function.

(Modification)

An optical module according to a modification of Embodiment 2 has photoelectric conversion device 110 and optical receptacle 220'. The optical module is used in a state in which optical transmission member 140 is connected through a ferrule to optical receptacle 220'.

Figure 14:
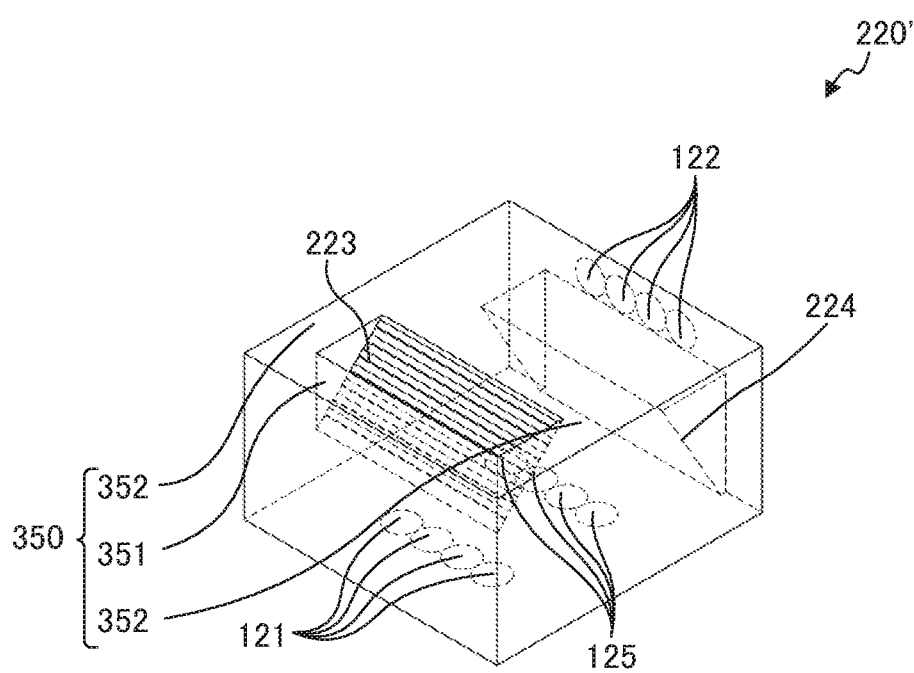
FIG. 14 is a perspective view of an optical receptacle according to a modification of Embodiment 2.

FIG. 14 is a perspective view of optical receptacle 220' according to the modification of Embodiment 2. As illustrated in FIG. 14, optical receptacle 220' according to the modification of Embodiment 2 has a plurality of first optical surfaces 121, a plurality of second optical surfaces 122, light separating section 223, reflecting surface 224, a plurality of third optical surfaces 125 and frame body 350.

Frame body 350 is disposed around light separating section 123 and reflecting surface 224. Frame body 350 has rear wall 351 located on the rear-face side of optical receptacle 220', and side-face walls 352 located at the side-face sides of optical receptacle 220'. The upper surface of frame body 350 is disposed so as to be coplanar with the upper surface of light separating section 223 and reflecting surface 224. By this means, light separating section 223 and reflecting surface 224 can be appropriately protected.

(Effects)

As described above, in optical receptacles 220 and 220' according to Embodiment 2, because emittance light L emitted from light emitting element 112 (light receiving element 113) passes through only first optical surface 121 and second optical surface 122 to reach optical transmission member 140, reflected light reflected at an interface and stray light can be reduced. Therefore, in optical receptacles 220 and 220' according to the present embodiment, the use efficiency of light can be improved in comparison to the conventional optical receptacle (optical receptacle 10 disclosed in PTL 1), similarly to optical receptacles 120 and 120' according to Embodiment 1. Further, in optical receptacles 220 and 220' according to the present embodiment, since an entire optical path between first optical surface 121 and second optical surface 122 is located inside optical receptacle 220 or 220', in comparison to optical receptacle 10 disclosed in PTL 1, the optical path length between first optical surface 121 and second optical surface 122 can be shortened. Hence, optical receptacles 220 and 220' can be reduced in size (reduced in height).

Further, since light separating section 223 has a plurality of first divided reflecting surfaces 132 and a plurality of second divided reflecting surfaces 233, light emitting surface 115 of light emitting element 112 and end surface 141 of optical transmission member 140 can be optically coupled in an appropriate manner irrespective of the assembling accuracy of light emitting element 112 and optical receptacle 220.

The present application claims priority based on Japanese Patent Application No. 2015-014292 filed on Jan. 28, 2015. The entire contents of the specification and drawings of Japanese Patent Application No. 2015-014292 are hereby incorporated by reference into the specification of the present application.

INDUSTRIAL APPLICABILITY

The optical receptacle and optical module according to the present invention are useful, for example, for optical communications which use an optical transmission member.

REFERENCE SIGNS LIST

10 Optical module
20 Photoelectric conversion device
21 Light emitting element
22 Optical transmission member
23 End surface
24 Detecting element
30 Optical receptacle
31 First optical surface
32 Second optical surface
33 Reflecting surface
34 Light separating section
35 Third optical surface
36 Recess
37 Incidence surface
100, 200 Optical module
110 Photoelectric conversion device
111 Substrate
112 Light emitting element
113 Light receiving element
114 Detecting element
115 Light emitting surface
116 Light receiving surface
117 Detection surface
120, 120', 220, 220' Optical receptacle
121 First optical surface
122 Second optical surface
123, 223 Light separating section
124, 224 Transmitting surface
125 Third optical surface
131, 231 Separating unit
132, 232 First divided reflecting surface
133, 233 Second divided reflecting surface
135, 235 Ridge line
140 Optical transmission member
141 End surface
234 Divided connecting surface
350 Frame body
351 Rear wall
352 Side-face wall
L Emittance light
Ls Signal light
Lm Monitoring light
Lr Reception light

What is claimed is:

1. An optical receptacle configured to be disposed between a photoelectric conversion device and one or more optical transmission members, the photoelectric conversion device including one or more photoelectric conversion elements and one or more detecting elements for monitoring emittance light emitted from the photoelectric conversion element, the optical receptacle being used for optically coupling a photoelectric conversion element of the one or more photoelectric conversion elements and an end surface of an optical transmission member of the one or more optical transmission members, the optical receptacle comprising:

one or more first optical surfaces that allow emittance light emitted from the photoelectric conversion element to be incident on a first optical surface of the one or more first optical surfaces, or that cause reception light emitted from the end surface of the optical transmission member and passing through inside to be emitted toward the photoelectric conversion element;

one or more second optical surfaces that cause emittance light incident on the first optical surface to be emitted toward the end surface of the optical transmission member, or allow reception light emitted from the end surface of the optical transmission member to be incident on a second optical surface of the one or more second optical surfaces;

a light separating section disposed on an optical path of light between the first optical surface and the second optical surface, the light separating section separating emittance light incident on the first optical surface into monitoring light and signal light directed toward the end surface of the optical transmission member, or the light separating section causing at least one part of reception light incident on the second optical surface to be reflected toward the first optical surface side;

a reflecting surface that internally reflects monitoring light separated by the light separating section; and one or more third optical surfaces that cause the monitoring light reflected by the reflecting surface to be emitted toward the detecting element;

wherein:

the light separating section includes a plurality of separating units that each include: a first divided reflecting surface that is an inclining surface with respect to an optical axis of emittance light incident on the first optical surface, and a second divided reflecting surface that is an inclining surface inclined at a different angle to the first divided reflecting surface with respect to the optical axis of the emittance light;

the first divided reflecting surface internally reflects a part of emittance light incident on the first optical surface toward the second optical surface side as the signal light, or internally reflects a part of reception light incident on the second optical surface toward the first optical surface side;

the second divided reflecting surface internally reflects a part of emittance light incident on the first optical surface toward the reflecting surface side as the monitoring light; and an entire optical path between the first optical surface, the light separating section and the second optical surface is located inside the optical receptacle.

2. The optical receptacle according to claim 1, wherein the plurality of separating units are arranged in an inclination direction of the first divided reflecting surface.

3. An optical module, comprising:
a photoelectric conversion device including a substrate, one or more photoelectric conversion elements disposed on the substrate, and one or more detecting elements disposed on the substrate for monitoring emittance light emitted from the photoelectric conversion element; and
an optical receptacle according to claim 1.

4. An optical module, comprising:
a photoelectric conversion device including a substrate, one or more photoelectric conversion elements disposed on the substrate, and one or more detecting elements disposed on the substrate for monitoring emittance light emitted from the photoelectric conversion element; and an optical receptacle according to claim 2.

* * * * *